United States Patent
Yamashita et al.

(10) Patent No.: US 8,164,005 B2
(45) Date of Patent: Apr. 24, 2012

(54) MULTILAYER HIGH-FREQUENCY CIRCUIT BOARD

(75) Inventors: Yuusuke Yamashita, Kawasaki (JP); Ryota Suzuki, Kawasaki (JP); Masahiro Tanabe, Kawasaki (JP); Taihei Nakada, Kawasaki (JP); Tsuyoshi Kumamoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 959 days.

(21) Appl. No.: 12/099,875

(22) Filed: Apr. 9, 2008

(65) Prior Publication Data

US 2008/0251288 A1    Oct. 16, 2008

(30) Foreign Application Priority Data

Apr. 10, 2007   (JP) .................................. 2007-103125

(51) Int. Cl.
*H05K 1/11* (2006.01)
(52) U.S. Cl. ........ 174/262; 174/250; 174/260; 174/264; 174/266; 174/520; 174/650; 361/794; 333/33; 333/246; 333/247
(58) Field of Classification Search .................. 174/262, 174/250, 260, 264, 266, 520, 650; 361/794, 361/749; 333/33, 246, 247
See application file for complete search history.

(56) References Cited

U.S. PATENT DOCUMENTS

| | | | | |
|---|---|---|---|---|
| 4,262,265 A | * | 4/1981 | Nygren et al. .................. 333/33 |
| 4,494,083 A | * | 1/1985 | Josefsson et al. ............... 333/33 |
| 4,846,696 A | * | 7/1989 | Morelli et al. .................. 439/31 |
| 4,851,794 A | * | 7/1989 | Williams et al. ................ 333/33 |
| 5,057,798 A | * | 10/1991 | Moye et al. ..................... 333/33 |
| 5,208,561 A | * | 5/1993 | Delestre et al. ............. 333/22 R |
| 5,830,301 A | * | 11/1998 | Sturzebecher et al. .... 156/89.16 |
| 5,914,693 A | * | 6/1999 | Takei et al. .................... 343/767 |
| 5,994,983 A | * | 11/1999 | Andersson .................... 333/246 |
| 6,023,211 A | * | 2/2000 | Somei ........................... 333/246 |
| 6,037,547 A | * | 3/2000 | Blish, II ........................ 174/264 |

(Continued)

FOREIGN PATENT DOCUMENTS

JP   3-257996   11/1991

(Continued)

OTHER PUBLICATIONS

Office Aciton issued Apr. 26, 2011 in Japanese Patent Application No. 2007-103125 (with Englis translation).

*Primary Examiner* — Xiaoliang Chen
(74) *Attorney, Agent, or Firm* — Oblon, Spivak, McClelland, Maier & Neustadt, L.L.P.

(57) ABSTRACT

A multilayer high-frequency circuit board includes a signal line, ground layers, and an interlayer circuit. A signal line where a high-frequency signal flows is formed in the signal line layer. The ground layers are laminated on both sides of the signal line layer, each of which is grounded. The interlayer circuit is provided in the signal line layer and includes a ground connecting portion connected to the ground layers and a signal line connecting portion connected to the signal line. One of the signal line connecting portion and the ground connecting portion surrounds an outer periphery of the other of the signal line connecting portion and the ground connecting portion concentrically with the one being separated from the outer periphery of the other along the signal line layer. An inner periphery of the one and the outer periphery of the other have a similar shape excluding a complete circle.

4 Claims, 3 Drawing Sheets

U.S. PATENT DOCUMENTS

| | | | |
|---|---|---|---|
| 6,342,682 B1* | 1/2002 | Mori et al. | 174/262 |
| 6,369,324 B1* | 4/2002 | Tomie | 174/650 |
| 6,388,208 B1* | 5/2002 | Kiani et al. | 174/266 |
| 6,400,234 B1* | 6/2002 | Ohhashi et al. | 333/33 |
| 6,433,650 B1* | 8/2002 | Harju et al. | 333/33 |
| 6,489,574 B1* | 12/2002 | Otaki et al. | 174/262 |
| 6,501,181 B2* | 12/2002 | Albinsson | 257/774 |
| 6,727,575 B2* | 4/2004 | Sakabe | 257/667 |
| 6,863,548 B1* | 3/2005 | Coccioli et al. | 439/101 |
| 7,030,712 B2* | 4/2006 | Brunette et al. | 333/33 |
| 7,388,424 B2* | 6/2008 | Miller | 327/551 |
| 7,405,477 B1* | 7/2008 | Tao et al. | 257/728 |
| 7,868,257 B2* | 1/2011 | Kushta et al. | 174/262 |
| 2001/0055203 A1* | 12/2001 | Asai et al. | 361/794 |
| 2003/0030516 A1* | 2/2003 | Tsukiyama et al. | 333/247 |
| 2003/0164244 A1* | 9/2003 | Miyazawa et al. | 174/52.4 |
| 2004/0124007 A1* | 7/2004 | Ashida | 174/260 |
| 2005/0046001 A1* | 3/2005 | Warner | 257/678 |
| 2005/0098348 A1* | 5/2005 | Okumichi et al. | 174/262 |
| 2007/0040735 A1* | 2/2007 | Matsuo et al. | 342/175 |
| 2007/0115474 A1* | 5/2007 | Chaton et al. | 356/445 |
| 2007/0241447 A1* | 10/2007 | Cheung et al. | 257/704 |
| 2008/0142975 A1* | 6/2008 | Ning | 257/758 |

FOREIGN PATENT DOCUMENTS

| | | |
|---|---|---|
| JP | 2000-68716 | 3/2000 |
| JP | 2001-144511 | 5/2001 |
| JP | 2001-345525 | 12/2001 |
| JP | 2004-281120 | 10/2004 |

* cited by examiner

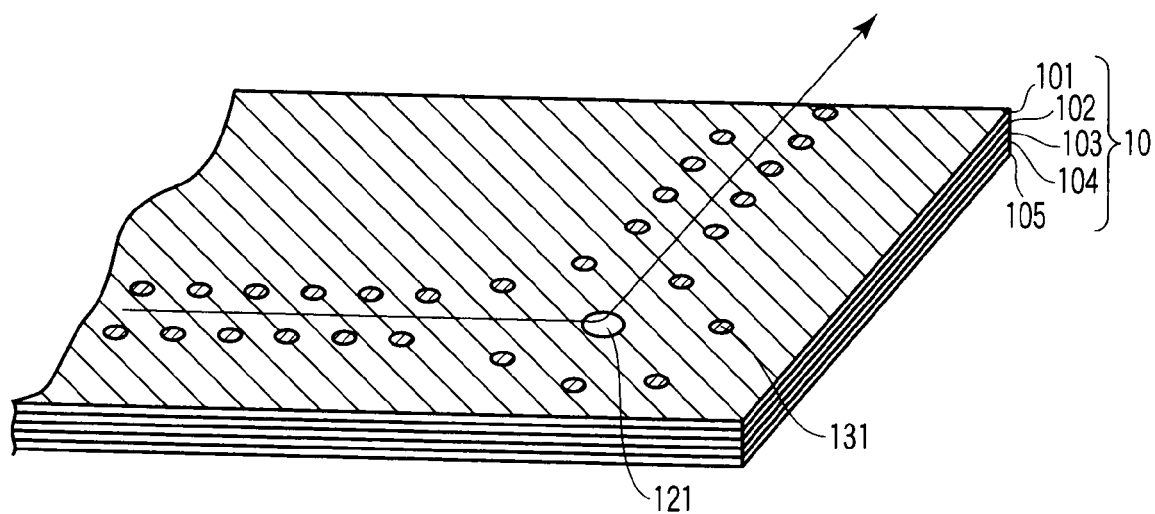
F I G. 1
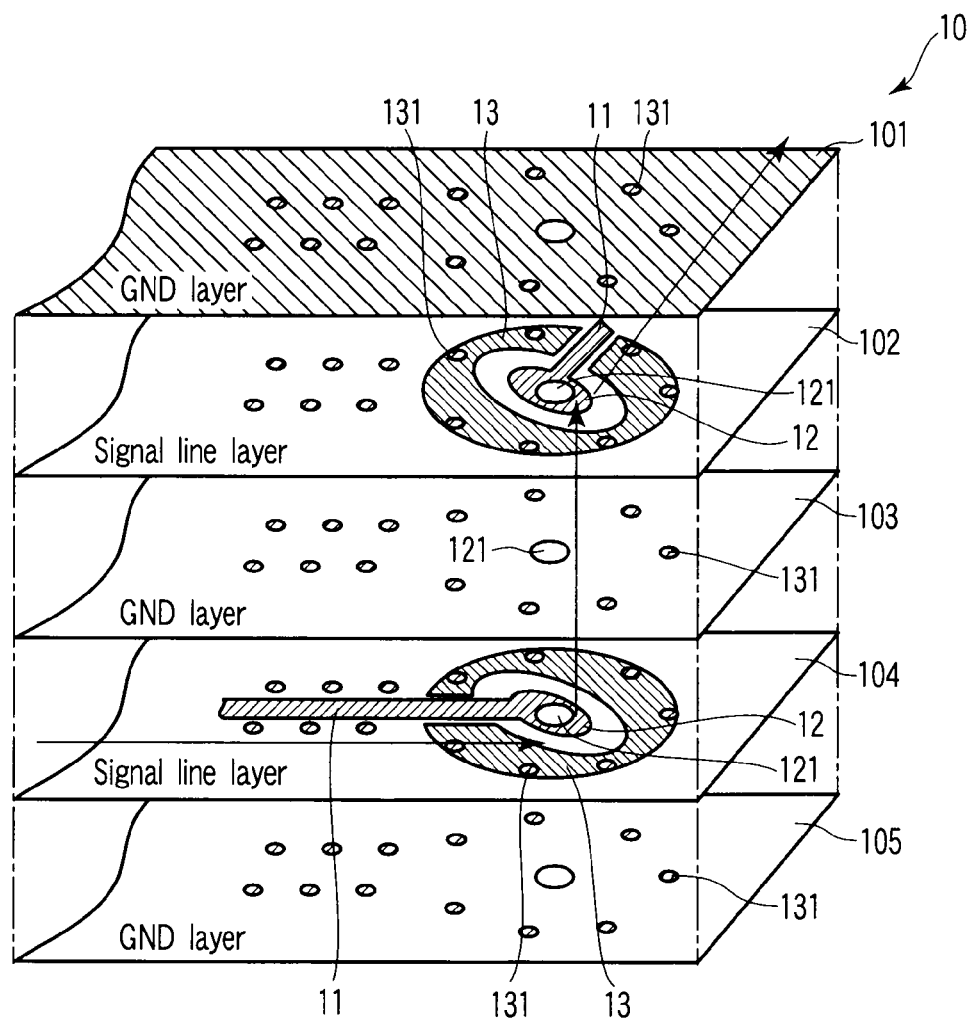
F I G. 2

MULTILAYER HIGH-FREQUENCY CIRCUIT BOARD

CROSS-REFERENCE TO RELATED APPLICATIONS

This application is based upon and claims the benefit of priority from prior Japanese Patent Application No. 2007-103125, filed Apr. 10, 2007, the entire contents of which are incorporated herein by reference.

BACKGROUND OF THE INVENTION

1. Field of the Invention

The present invention relates to a multilayer high-frequency circuit board.

2. Description of the Related Art

In a high-frequency circuit board used in a high frequency band of, for example, a microwave transmitter or a millimeter wave transmitter, impedance matching at an interface among a plurality of circuits in the high-frequency circuit board is important to cause the high-frequency circuit board to perform a desired performance.

Placing an intermediate board between a coaxial connector and a multilayer high-frequency circuit board is well known from Jpn. Pat. Appln. KOKAI Publication No. 2004-281120 in order to significantly reduce an impedance disturbance in an electrical connection between the coaxial connector and multilayer high-frequency circuit board.

In recent years, however, high-precision impedance matching is strongly demanded in an interlayer connection circuit by which multilayer signal lines are connected in a multilayer high-frequency circuit board.

FIG. 5 schematically shows a configuration of a conventional interlayer circuit in which impedance matching is performed. The conventional interlayer circuit includes a complete circular signal line connecting portion 3 connected to a signal line 2 in a signal line layer 1c between two ground (GND) layers 1a and 1b, and an approximately ring-shaped ground connecting portion 4 provided concentrically around the signal line connecting portion 3 in the signal line layer 1c. The ground connecting portion 4 has an approximate C shape which surrounds the signal line connecting portion 3 and a part of which corresponding to the signal line 2 is notched. The ground connecting portion 4 is electrically connected to the ground layers 1a and 1b by a plurality of electrical connection through-holes 4a arranged on the ground connecting portion 4 concentrically around the signal line connecting portion 3.

As shown in FIG. 6, impedance matching in this conventional interlayer circuit is performed by selecting values of three parameters which include a distance A from a center O of the signal line connecting portion 3 to an outer edge of the signal line connecting portion 3; a distance B from the center O to an outer edge of the ground connecting portion 4; and a distance D from the outer edge of the signal line connecting portion 3 to an inner edge of the ground connecting portion 4.

However, since impedance matching is performed in such a conventional interlayer circuit on a basis of these three parameters, there is a limit to achievable precision in a tuning of impedance matching.

BRIEF SUMMARY OF THE INVENTION

According to one aspect of the present invention, a multilayer high-frequency circuit board includes a signal line layer, ground layers, and an interlayer circuit. A signal line where a high-frequency signal flows is formed in the signal line layer. The ground layers are laminated on both sides of the signal line layer, each of which is grounded. The interlayer circuit is provided in the signal line layer and includes a ground connecting portion connected to the ground layers and a signal line connecting portion connected to the signal line. One of the signal line connecting portion and the ground connecting portion surrounds an outer periphery of the other of the signal line connecting portion and the ground connecting portion concentrically with the one being separated from the outer periphery of the other along the signal line layer. An inner periphery of the one and the outer periphery of the other have a similar shape excluding a complete circle.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a perspective view schematically showing an appearance of a multilayer high-frequency circuit board according to an embodiment of the present invention;

FIG. 2 is a schematic exploded perspective view of an interlayer circuit and surroundings thereof in the multilayer high-frequency circuit board in FIG. 1;

DETAILED DESCRIPTION OF THE INVENTION

Figure 3:
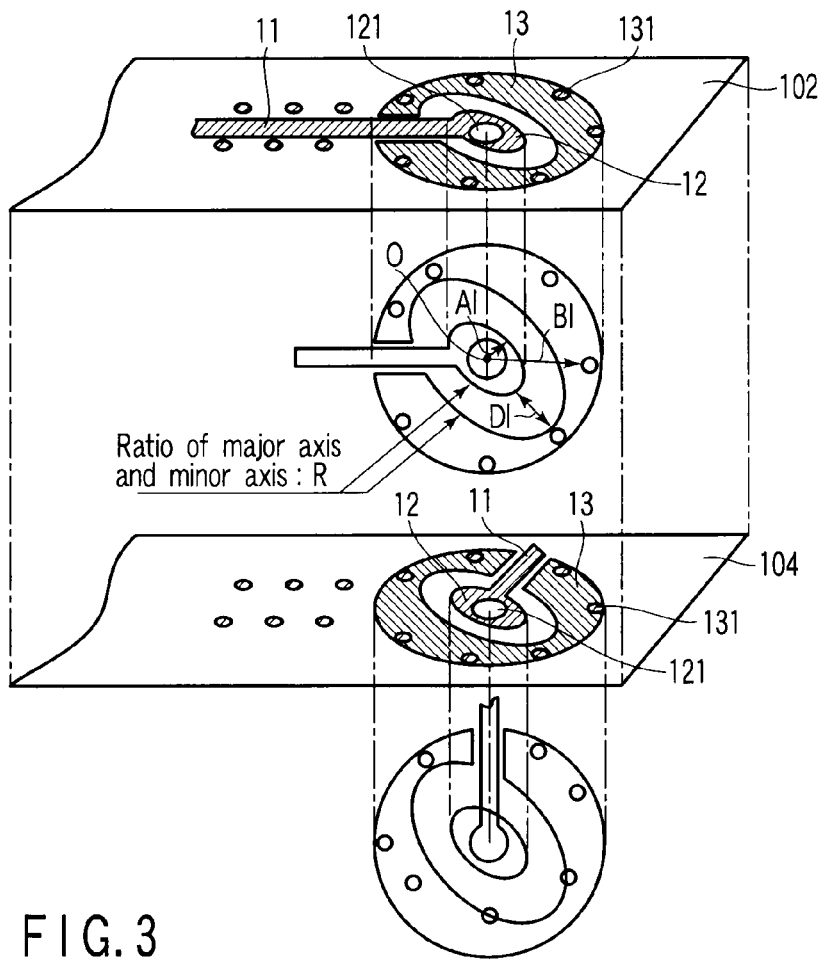
FIG. 3 is a schematic perspective view illustrating a setting of tuning for impedance matching in the interlayer circuit provided in a signal line layer shown in FIG. 2.

In the followings, various embodiments of the present invention will be described with reference to FIGS. 1 to 4.

FIG. 1 schematically shows an appearance of a multilayer high-frequency circuit board 10 according to one embodiment of the present invention. The multilayer high-frequency circuit board 10 includes a first layer 101, a second layer 102, a third layer 103, a fourth layer 104, and a fifth layer 105. As shown in FIG. 2, the first layer 101, the third layer 103, and the fifth layer 105 each configures a ground (GND) layer having a ground circuit for grounding, and the second layer 102 and the fourth layer 104 each configures a signal line layer in which a signal line 11 where a high-frequency signal flows is formed. The first layer 101, the second layer 102, the third layer 103, the fourth layer 104, and the fifth layer 105 are laminated to configure tri-plate lines of two-layers. End portions of the two signal lines 11, 11 of the second and fourth layers 102 and 104 are arranged so that the two signal lines 11, 11 cross each other at 90 degrees.

A signal line connecting portion 12 having an outer periphery in any shape excluding a complete circle, for example, an elliptical shape is formed at each end portion of the two signal lines 11, 11 overlapping each other. The signal line connecting portion 12 functions as a central conductor of an interlayer circuit. An electrical connection through-hole 121 is formed in a center of the signal line connecting portion 12. The two signal line connecting portions 12, 12 of the two signal lines 11, 11 of the second and fourth layers 102 and 104 are electrically connected via the electrical connection through-hole 121 of each of the second layer 102 and the fourth layer 104 and electrical connection through-holes 121 formed in the third layer 103 between the second layer 102 and the fourth layer 104 to correspond to the electrical connection through-hole 121 of each of the second layer 102 and the fourth layer 104.

A ground connecting portion 13 in an approximate C shape is provided around the signal line connecting portion 12 in each of the second layer 102 and the fourth layer 104. The ground connecting portion 13 concentrically surrounds the signal line connecting portion 12 excluding the signal line 11 with the ground connecting portion 13 being separated from the signal line joint 12 along each of the second layer 102 and the fourth layer 104. The ground connecting portion 13 functions as an outer conductor of the interlayer circuit.

A plurality of electrical connection through-holes 131 is formed in the ground connecting portion 13 so that the electrical connection through-holes 131 are arranged concentrically around the center of the central conductor of the signal line connecting portion 12. The ground connecting portion 13 of the second layer 102 and that of the fourth layer 104 are electrically connected ground circuits of the first layer 101, the third layer 103, and the fifth layer 105 on both sides of each of the second layer 102 and the fourth layer 104 via the electrical connection through-holes 131 formed in the first layer 101, the third layer 103, and the fifth layer 105 to correspond to the electrical connection through-holes 131 of the ground connecting portions 13 of the second and fourth layers 102 and 104.

An inner periphery of the ground connecting portion 13 has a shape similar to that of an outer periphery of the signal line connecting portion 12, that is, any shape excluding a complete circle, for example, an elliptic shape.

In the multilayer high-frequency circuit board 10, the two signal line connecting portions 12 of the second layer 102 and the fourth layer 104 are electrically connected with each other via the electrical connection through-holes 121 thereof and the electrical connection through-hole 121 of the third layer 103, and further the two signal lines 11 and 11 of the second layer 102 and the fourth layer 104 make a directional change by 90 degrees. Further, the two ground connecting portions 13 of the second layer 102 and the fourth layer 104 are electrically connected to the ground circuits of the first layer 101, the third layer 103, and the fifth layer 105 via the plurality of electrical connection through-holes 131 thereof and the plurality of electrical connection through-holes 131 of each of the first layer 101, the third layer 103, and the fifth layer 105 on both sides of the second layer 102 and the fourth layer 104. The electrical connection through-holes 131 are ground connection positions where each of the ground connecting portions 13 is connected to the ground layers on both sides thereof, that is, the first layer 101 and the third layer 103, or the third layer 103 and the fifth layer 105.

Since the outer periphery of the signal line connecting portion 12 and the inner periphery of the ground connecting portion 13 have similar shapes, in an insulating region existing therebetween, any position along the outer periphery of the signal line connecting portion 12 is equidistantly separated from an opposite position of the inner periphery of the ground connecting portion 13 opposing to that any position. Accordingly, the electrical connection through-hole 121 of the signal line connecting portion 12 and the plurality of electrical connection through-holes 131 of the ground connecting portion 13 surrounding the signal line connecting portion 12 are equivalent to a coaxial line in which the electrical connection through-hole 121 of the signal line connecting portion 12 is a central conductor and the plurality of electrical connection through-holes 131 of the ground connecting portion 13 are ground lines.

In the interlayer circuit configured by the combination of the signal line connecting portion 12 and the ground connecting portion 13 as described above, a distance A1 from a center O of the signal line connecting portion 12 to a position of the outer periphery of the signal line joint 12 in a minor axis direction of an ellipse, a distance B1 from the center O to the electrical connection through-hole 131 which is the ground connection position of the ground connecting portion 13, a distance D1 from the outer periphery of the signal line connecting portion 12 to the inner periphery of the ground connecting portion 13, and a ratio (major axis-minor axis ratio) R of the length of the ellipse in the major axis direction and that in the minor axis direction, shown in FIG. 3, are parameters required for a design of tuning for impedance matching.

Therefore, when the tuning for impedance matching of the interlayer circuit is designed, desired impedance matching can be obtained precisely by changing each value of the above described distance A1, the distance B1, the distance D1, and the major axis-minor axis ratio R.

When the signal line 11 of the second layer 102 and that of the fourth layer 104 make a directional change by 90 degrees as in this embodiment, a precise design of tuning for a desired impedance matching can be performed more easily by arranging the major axis of the ellipse in the interlayer circuit of the second layer 102 and that of the ellipse in the interlayer circuit of the fourth layer 104 so that these axes match a bisector of an interior angle of the directional change by 90 degrees.

That is, when two signal lines of two signal line layers make a directional change in the two signal line layers, the distribution of electromagnetic field between the signal line connecting portion 12 at the center of each of the two interlayer circuits and the ground connecting portion 13 surrounding the signal line connecting portion 12 is asymmetric with respect to each signal line. But, the impedance matching for the asymmetrically distributed electromagnetic field can be performed easily by matching the major axis of the ellipse of each of the two interlayer circuits to the bisector of an interior angle of a directional change angle of the two signal lines.

Figure 4:
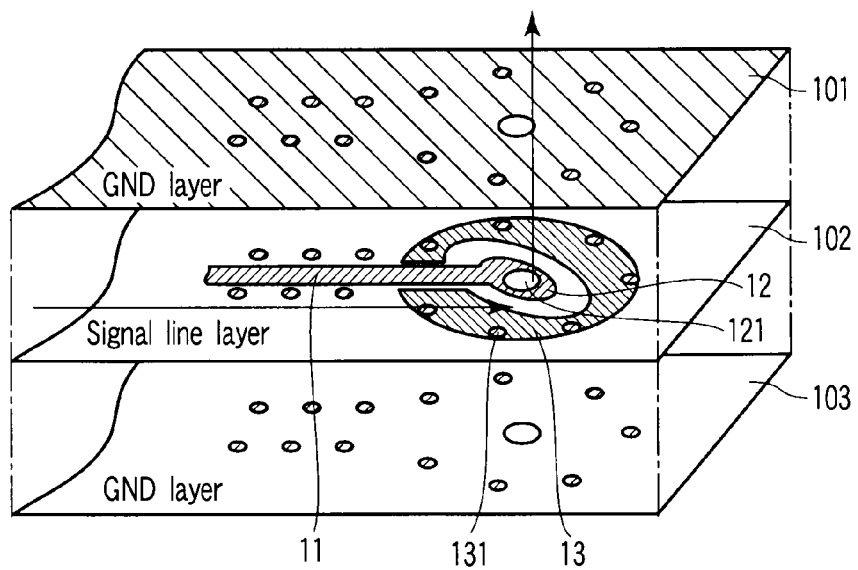
FIG. 4 is a schematic exploded perspective view of an interlayer circuit and surroundings thereof in a multilayer high-frequency circuit board according to another embodiment of the present invention.
Figure 5:
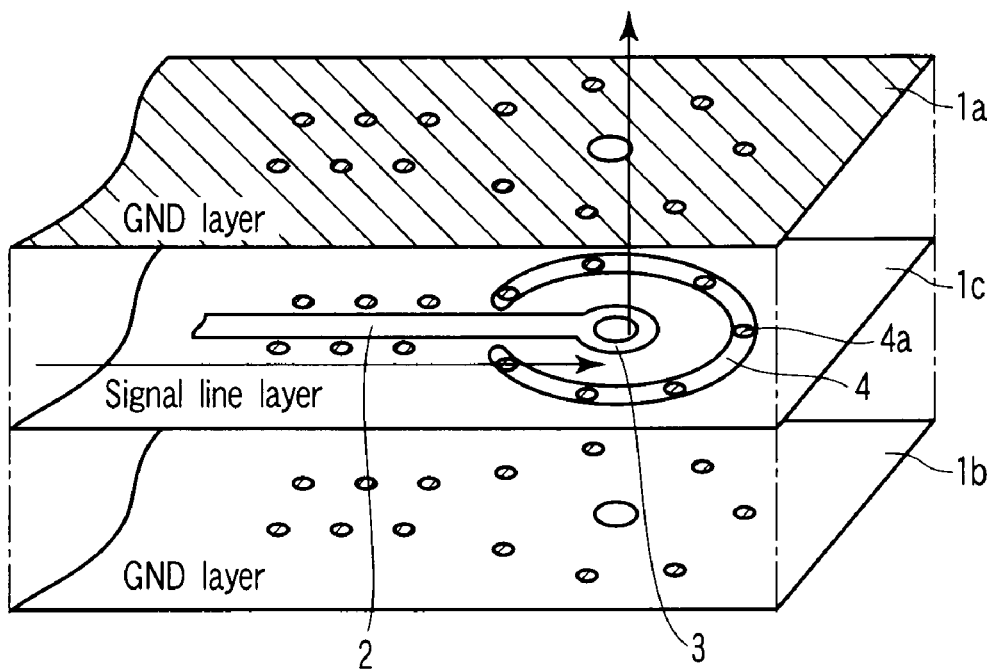
FIG. 5 is a schematic exploded perspective view of an interlayer circuit and surroundings thereof in a conventional multilayer high-frequency circuit board.
Figure 6:
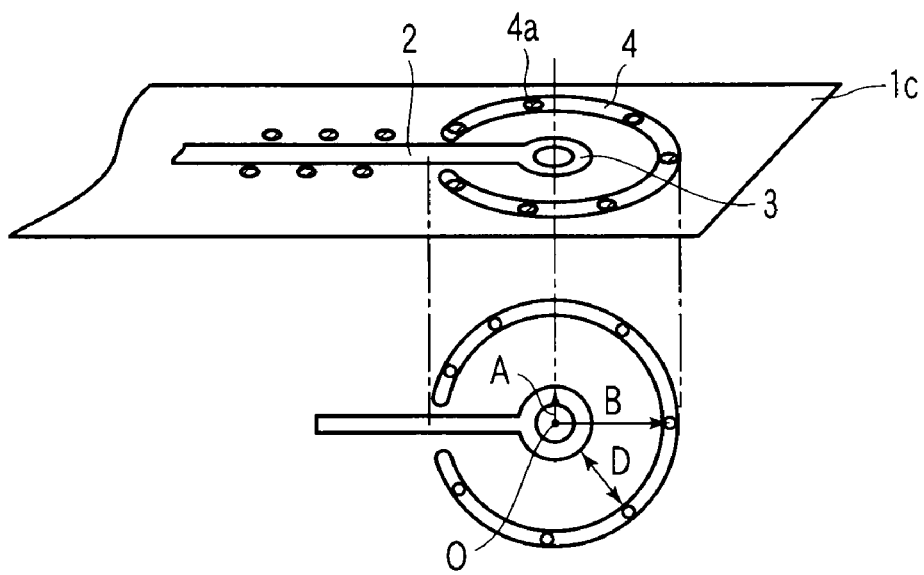
FIG. 6 is a schematic perspective view illustrating a setting of tuning for impedance matching in the interlayer circuit provided in a signal line layer shown in FIG. 5.

The concept of the present invention is applicable not only to the multilayer high-frequency circuit board 10 according to the embodiment described above with reference to FIGS. 1 to 3, but also to a multilayer high-frequency circuit board in which a first layer, a second layer, and a third layer are laminated as shown in FIG. 4 to configure a tri-plate line of one layer, thereby providing technical advantages similar to those of the above embodiment.

In FIG. 4, the same members as those shown in FIG. 2 are denoted by the same reference numerals and detailed descriptions of these members are omitted.

In the multilayer high-frequency circuit board shown in FIG. 4, the signal line connecting portion 12 connected to the signal line 11 in the second layer 102, which is a signal line layer, and the ground connecting portion 13 connected to the ground circuits of the first layer 101 and the third layer 103, which are ground layers, configure an interlayer circuit that connects the above described tri-plate line of one layer to a central conductor and outer conductor of an external contact such as a coaxial connector (not shown).

A multilayer high-frequency circuit board according to the present invention is not limited to the multilayer high-frequency circuit board 10 with the five-layer structure in which five layers are laminated to configure the tri-state circuits of two-layers described above with reference to FIGS. 1 to 3 or the multilayer high-frequency circuit board with the three-layer structure in which three layers are laminated to configure the tri-state circuit of one-layer described above with reference to FIG. 4. That is, the present invention is also applicable to a multilayer high-frequency circuit board in which seven or more layers are laminated to configure tri-state circuits of three or more layers, and the technical advantages similar to those of the multilayer high-frequency circuit board 10 described above can be obtained.

Further, in the above described two embodiments, the outer periphery of the signal line connecting portion 12 is formed by an elliptical shape, the inner periphery of the ground connecting portion 13 is formed by an elliptical shape which is similar to that of the outer periphery of the signal line connecting portion 12, and the signal line connecting portion 12 and the ground connecting portion 13 are concentrically arranged.

However, it may be possible that each of the outer periphery of the signal line connecting portion 12 and the inner periphery of the ground connecting portion 13 is formed by any similar shape excluding a complete circle and that the signal line connecting portion 12 and the ground connecting portion 13 are concentrically arranged. Also, in this case, the technical advantages similar to those of the above described multilayer high-frequency circuit board 10 may be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multilayer high-frequency circuit board, comprising:
    a signal line layer in which a signal line for a high-frequency signal transmission is formed, the signal line including a first longitudinally extending side and a second longitudinally extending side;
    ground layers which are laminated on both sides of the signal line layer and each of which is grounded; and
    an interlayer circuit which is provided in the signal line layer which includes a signal line connecting portion connected to the signal line and having a center and an outer periphery, and which includes a ground connecting portion connected to the ground layers, extending concentrically with the signal line connecting portion from the first longitudinally extending side of the signal line to the second longitudinally extending side of the signal line around the outer periphery of the signal line connecting portion and having an inner periphery and an outer periphery, the inner periphery of the ground connecting portion surrounding the outer periphery of the signal line connecting portion with a gap between the inner periphery of the ground connecting portion and the outer periphery of the signal line connecting portion, wherein the outer periphery of the signal line connecting portion and the inner periphery of the ground connecting portion have similar shapes that are non-circular, and the outer periphery of the ground connecting portion has a circular shape being concentric with the center of the signal line connecting portion.

2. The multilayer high-frequency circuit board according to claim 1, wherein
    each of the inner periphery of the ground connecting portion and the outer periphery of the signal line connecting portion is an ellipse having a minor axis and a major axis.

3. The multilayer high-frequency circuit board according to claim 2, wherein
    ground connecting positions for connecting the ground connecting portion to the ground layers on both sides of the signal line layer are arranged in the ground connecting portion individually to each other and concentrically around the center of the signal line connecting portion, and
    wherein matching of an asymmetrical electromagnetic field distribution between the signal line connecting portion and the ground connecting portion is specified by at least four parameters including a distance from the center of the signal line connecting portion to the outer periphery of the signal line connecting portion in a direction along the minor axis of the outer periphery, a distance from the center of the signal line connecting portion to any one of the ground connection positions of the ground connecting portion, a distance from the outer periphery of the signal line connecting portion to the inner periphery of the ground connecting portion, and a ratio of a length of the ellipse in a direction along the major axis and a length of the ellipse in a direction along the minor axis.

4. The multilayer high-frequency circuit board according to claim 3, further comprising:
    a plurality of the signal line layers and a plurality of the ground layers arranged alternately, wherein
    the two signal lines of the two signal line layers adjacent to each other with the one ground layer interposed therebetween intersect at 90 degrees in the two signal line connecting portions of the two interlayer circuits in the two signal line layers, and
    the major axis of the ellipse is arranged to extend in a direction along a bisector of an interior angle between the two signal lines intersecting at 90 degrees.

* * * * *